United States Patent
Chen

(10) Patent No.: US 9,418,743 B1
(45) Date of Patent: Aug. 16, 2016

(54) 3D NAND MEMORY WITH DECODER AND LOCAL WORD LINE DRIVERS

(71) Applicant: MACRONIX INTERNATIONAL CO., LTD., Hsinchu (TW)

(72) Inventor: Shih-Hung Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/623,963

(22) Filed: Feb. 17, 2015

(51) Int. Cl.
*G11C 5/06* (2006.01)
*G11C 16/08* (2006.01)

(52) U.S. Cl.
CPC ................................. *G11C 16/08* (2013.01)

(58) Field of Classification Search
USPC ....................................... 365/63, 148, 185.17
See application file for complete search history.

(56) References Cited

U.S. PATENT DOCUMENTS

| | | | |
|---|---|---|---|
| 6,906,940 B1 | 6/2005 | Lue | |
| 7,315,474 B2 | 1/2008 | Lue | |
| 7,420,242 B2 | 9/2008 | Lung | |
| 7,696,559 B2 | 4/2010 | Arai et al. | |
| 7,851,849 B2 | 12/2010 | Kiyotoshi | |
| 8,013,383 B2 | 9/2011 | Kidoh et al. | |
| 8,208,279 B2 * | 6/2012 | Lue | H01L 27/0688 365/148 |
| 8,363,476 B2 | 1/2013 | Lue et al. | |
| 8,467,219 B2 | 6/2013 | Lue | |
| 8,503,213 B2 | 8/2013 | Chen et al. | |
| 8,759,899 B1 | 6/2014 | Lue et al. | |
| 2005/0280061 A1 | 12/2005 | Lee | |
| 2007/0045708 A1 | 3/2007 | Lung | |
| 2007/0252201 A1 | 11/2007 | Kito et al. | |
| 2008/0073635 A1 | 3/2008 | Kiyotoshi et al. | |

(Continued)

FOREIGN PATENT DOCUMENTS

EP 2048709 A2 4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Vu Le
(74) *Attorney, Agent, or Firm* — Haynes Beffel & Wolfeld LLP

(57) ABSTRACT

A memory device includes a plurality of stacks of conductive strips, a plurality of conductive vertical structures arranged orthogonally to the plurality of stacks, memory elements in interface regions at cross-points between side surfaces of the plurality of stacks and the plurality of conductive vertical structures, multiples pluralities of conductive lines, and control circuitry. The plurality of stacks of conductive strips alternate with insulating strips, including at least a bottom layer of conductive strips, a plurality of intermediate layers of conductive strips, and a top layer of conductive strips. A first plurality of conductive lines electrically couple to the top layer of the conductive strips. A second plurality of conductive lines and a third plurality of conductive lines electrically couple to the plurality of intermediate layers. The control circuitry causes the first plurality of conductive lines to select at least a first particular stack in the plurality of stacks, the second plurality of conductive lines to select at least the first particular stack in the plurality of stacks, and the third plurality of conductive lines to select at least one particular layer in the plurality of intermediate layers.

20 Claims, 17 Drawing Sheets

(56) References Cited

U.S. PATENT DOCUMENTS

| | | |
|---|---|---|
| 2008/0175032 A1 | 7/2008 | Tanaka et al. |
| 2008/0180994 A1 | 7/2008 | Katsumata et al. |
| 2009/0097321 A1 | 4/2009 | Kim et al. |
| 2009/0184360 A1 | 7/2009 | Jin et al. |
| 2010/0270593 A1 | 10/2010 | Lung et al. |
| 2012/0068255 A1* | 3/2012 | Lee .................. H01L 27/11582 257/324 |
| 2012/0119283 A1 | 5/2012 | Lee et al. |
| 2012/0182806 A1 | 7/2012 | Chen et al. |
| 2012/0299086 A1 | 11/2012 | Lee |

OTHER PUBLICATIONS

Choi et al., "Performance Breakthrough in NOR Flash Memory with Dopant-Segregated Schottky-Barrier (DSSB) SONOS Devices", 2009 Symposium on VLSI Technology Digest of Technical Papers, p. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D Nand Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka H., et al., "Bit Cost Scalable Technology with Punch and Plug Process for Ultra High Density Flash Memory," 2007 Symp. VLSI Tech., Digest of Tech. Papers, pp. 14-15.

U.S. Appl. No. 14/284,306, filed May 21, 2014 by Hang-Ting Lue, 60 pages.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

\* cited by examiner

3D NAND MEMORY WITH DECODER AND LOCAL WORD LINE DRIVERS

BACKGROUND

1. Field of the Invention

The present invention relates to high density memory devices, and particularly to memory devices in which multiple planes of memory cells are arranged to provide a three-dimensional 3D array.

2. Description of Related Art 3D memory devices have been developed in a variety of configurations that include vertical channel structures. In vertical channel structures, memory cells including charge storage structures are disposed at interface regions between horizontal planes of conductive strips arranged as word lines, and vertical active strips including channels for the memory cells.

A memory device can include multiple planes of memory cells that includes an arrangement of multiple stacks of horizontal conductive strips, or word lines. The trend of increasing memory capacity tends to increase the number of stacks of horizontal conductive strips, which are selected by string select lines. Unfortunately, this increased number of stacks causes increased capacitance, noise, and power consumption.

One approach to increase memory capacity without just increasing the number of stacks of horizontal conductive strips, is to increase the number of planes and the number of staircase contacts accessing the increased number of planes. However, this approach is associated with increased density of the conductive lines that electrically couple the increased number of staircase contacts with the decoder. Such increased density introduces another set of manufacturing process challenges.

It is desirable to provide a structure for three-dimensional integrated circuit memory using a vertical channel structure that can decrease the trade-offs that come with increased memory capacity.

SUMMARY

In various aspects of the technology, a plurality of conductive lines, such as block select lines, control switches such as transistors. Another plurality of conductive lines, such as layer select lines, carry layer select signals that in turn select particular planes of word lines. The transistors control whether the layer select lines are electrically coupled to the different planes of word lines. Whereas layer select lines alone would result in turning on all word lines in a selected plane, the layer select lines in combination with the block select lines result in turning on only a selected subset of all word lines in a selected plane. Yet another plurality of conductive lines, such as string select lines, select particular stacks of conductive strips, such as by turning on access transistors on ends of NAND strings of series connected memory transistors. Both the string select signals carried by string select lines, and the block select signals carried by the block select lines, select particular stacks of conductive strips. Such an arrangement of pluralities of conductive lines permits increased memory capacity without requiring trade-offs as discussed above. Various aspects of the technology are discussed below.

One aspect of the technology is a memory device. The memory device includes a plurality of stacks of conductive strips, a plurality of semiconductive vertical structures arranged orthogonally to the plurality of stacks, memory elements in interface regions at cross-points between side surfaces of the plurality of stacks and the plurality of semiconductive vertical structures, multiples pluralities of conductive lines, and control circuitry.

The plurality of stacks of conductive strips alternate with insulating strips, including at least a bottom layer of conductive strips, a plurality of intermediate layers of conductive strips, and a top layer of conductive strips.

A first plurality of conductive lines electrically couple to the top layer of the conductive strips. A second plurality of conductive lines and a third plurality of conductive lines electrically couple to the plurality of intermediate layers.

The control circuitry causes the first plurality of conductive lines to select at least a first particular stack in the plurality of stacks, the second plurality of conductive lines to select at least the first particular stack in the plurality of stacks, and the third plurality of conductive lines to select at least one particular layer in the plurality of intermediate layers.

Another aspect of the technology includes a decoder for each plurality of conductive lines.

Yet another aspect of the technology is a method, comprising:

causing a first plurality of conductive lines to select at least a first particular stack in a plurality of stacks of conductive strips alternating with insulating strips, wherein the plurality of stacks includes at least a bottom layer of conductive strips, a plurality of intermediate layers of conductive strips, and a top layer of conductive strips, and wherein the first plurality of conductive lines is electrically coupled to the top layer of the conductive strips;

causing a second plurality of conductive lines to select at least the first particular stack in the plurality of stacks, the second plurality of conductive lines electrically coupled to the plurality of intermediate layers; and causing the third plurality of conductive lines to select at least one particular layer in the plurality of intermediate layers, the second plurality of conductive lines electrically coupled to the plurality of intermediate layers, wherein the first plurality of conductive lines, the second plurality of conductive lines, and the third plurality of conductive lines assist selection of at least one of the memory elements in interface regions at cross-points between side surfaces of the plurality of stacks and a plurality of semiconductive vertical structures arranged orthogonally to the plurality of stacks.

In one embodiment of the technology, the first plurality of conductive lines are string select lines, the second plurality of conductive lines are electrically coupled to switches that electrically couple the third plurality of conductive lines to the conductive strips, and the third plurality of conductive lines are layer select lines. In one embodiment of the technology, the switches are transistors with lateral gates positioned over lateral conductive channels that electrically couple the conductive strips and the third plurality of conductive lines. In one embodiment of the technology, the switches are transistors with gates surrounding vertical conductive channels that electrically couple the conductive strips and the third plurality of conductive lines.

In one embodiment of the technology, the third plurality of conductive lines is electrically coupled to the plurality of intermediate layers via the second plurality of conductive lines.

In one embodiment of the technology, different layers of the plurality of intermediate layers are electrically coupled to different steps of staircase contacts, and different conductive lines in the third plurality of conductive lines are electrically coupled to the different steps.

In one embodiment of the technology, the second plurality of conductive lines includes a particular decoding line that selects multiple stacks in the plurality of stacks, the multiple stacks in the plurality of stacks are electrically coupled to a first set of multiple conductive lines in the first plurality of conductive lines, and different lines in the first set of multiple conductive lines selects different stacks from the multiple stacks.

In one embodiment of the technology, a first conductive decoding line of the second plurality of conductive lines selects only one stack from the plurality of stacks.

In one embodiment of the technology, the control circuitry causes the first plurality of conductive lines to select at least the first particular stack in the plurality of stacks and deselect other stacks in the plurality of stacks, the second plurality of conductive lines to select at least the first particular stack in the plurality of stacks and deselect other stacks in the plurality of stacks, and the third plurality of conductive lines to select at least one particular layer in the plurality of layers and deselect other layers in the plurality of layers.

One embodiment of the technology further comprises a fourth plurality of conductive lines electrically coupled to the plurality of semiconductive vertical structures, wherein the control circuitry causes the fourth plurality of conductive lines to select a subset of the plurality of semiconductive vertical structures, the subset arranged in a row orthogonal to the plurality of stacks.

In one embodiment of the technology, the third plurality of conductive lines are parallel to the fourth plurality of conductive lines.

One embodiment of the technology further comprises a first decoder electrically coupled to the first plurality of conductive lines; a second decoder electrically coupled to the second plurality of conductive lines, wherein the first decoder and the second decoder are on first and second sides of the plurality of stacks on opposite sides of the plurality of stacks, and the first plurality of conductive lines are parallel to the second plurality of conductive lines; and a third decoder electrically coupled to the third plurality of conductive lines, wherein the third decoder is on a third side of the plurality of stacks different from the first and second sides of the plurality of stacks.

Other aspects and advantages of the present invention can be seen on review of the drawings, the detailed description and the claims, which follow.

DETAILED DESCRIPTION

Figure 1:
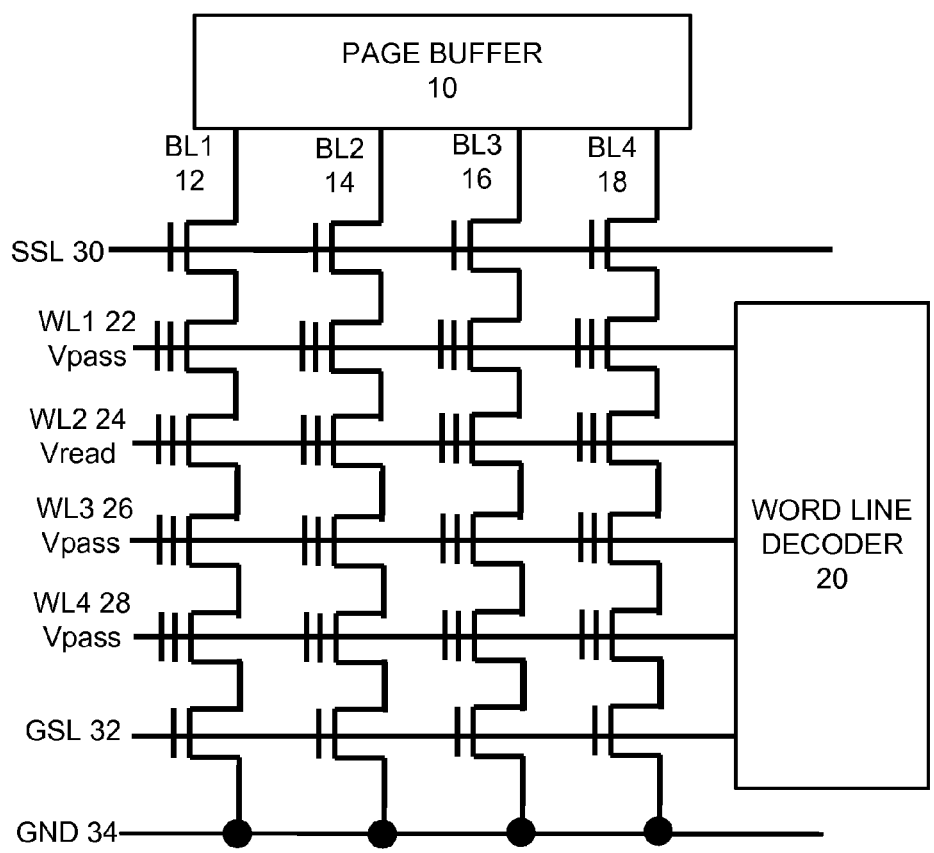
FIG. 1 is a simplified circuit diagram of an example 2D memory array.

A detailed description of embodiments of the present invention is provided with reference to the Figures. It is to be understood that there is no intention to limit the invention to the specifically disclosed structural embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

FIG. 1 is a simplified circuit diagram of an example 2D memory array.

Multiple NAND strings of series connected memory cells are accessed by bit lines BL1 12, BL2 14, BL3 16, and BL4 18. The NAND strings have first ends connected to page buffer 10 via the bit lines. The NAND strings have second ends at GND 34. The first ends of the NAND strings connected to the page buffer 10 have access transistors controlled by string select line SSL 30. The second ends of the NAND strings, connected to GND 34, have access transistors controlled by ground select line GSL 32. The different memory cells along the NAND strings are accessed by word lines WL1 22, WL2 24, WL3 26, and WL4 28, which are controlled by word line decoder 20.

Figure 2:
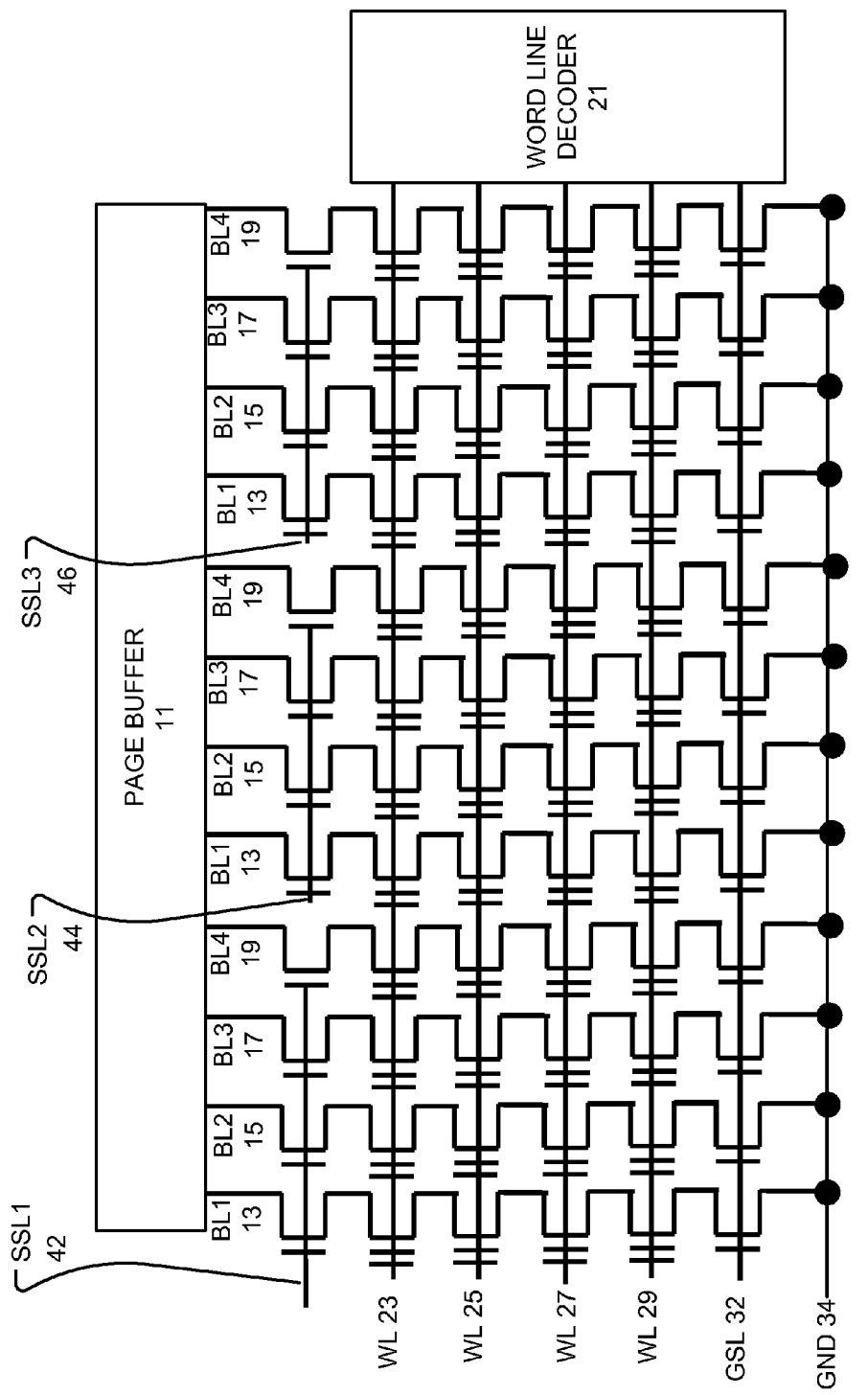
FIG. 2 is a simplified circuit diagram of an example 3D memory array using a vertical channel structure.

FIG. 2 is a simplified circuit diagram of an example 3D memory array using a vertical channel structure.

The 3D array is physically configured as multiple adjacent 2D arrays. For illustration purposes, the simplified circuit diagram shows the multiple 2D arrays side-by-side.

Multiple NAND strings of series connected memory cells are accessed by bit lines BL1 13, BL2 15, BL3 17, and BL4 19. The same bit lines are shared among the multiple 2D arrays. The NAND strings have first ends connected to page buffer 11 via the bit lines. The NAND strings have second ends at GND 34. The first ends of the NAND strings connected to the page buffer 11 have access transistors controlled by string select lines SSL1 42, SSL2 44, and SSL3 46. The particular 2D array in the multiple 2D arrays is selected by the corresponding string select lines SSL1 42, SSL2 44, and SSL3 46 which controls access transistors in the desired 2D array. The second ends of the NAND strings, connected to GND 34, have access transistors controlled by ground select line GSL 32. The different memory cells along the NAND strings are accessed by word lines WL1 23, WL2 25, WL3 27, WL4 29, which are controlled by word line decoder 21.

Figure 3:
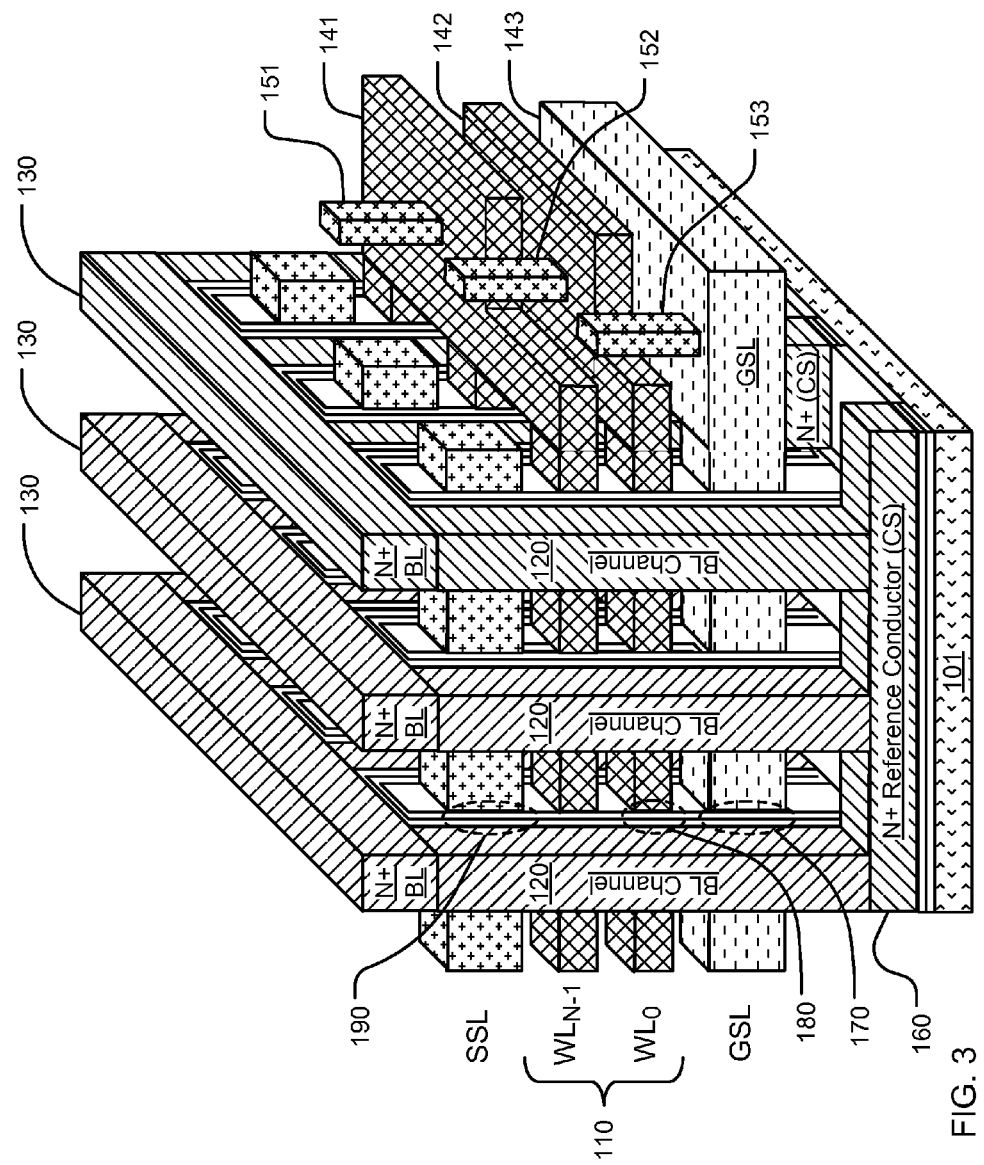
FIG. 3 is a schematic diagram of an example 3D memory array using a vertical channel structure.

FIG. 3 is a schematic diagram of an example 3D memory array using a vertical channel structure.

The memory device includes an array of NAND strings of memory cells, and can be a double-gate vertical channel memory array (DGVC). In the example shown in FIG. 3, the 3D memory array includes an integrated circuit substrate, and a plurality of stacks of conductive strips separated by insulating material, including at least a bottom plane of conductive strips (GSL), a plurality of intermediate planes of conductive strips (WLs) ranging from $WL_0$ to $WL_{N-1}$, and a top plane of conductive strips (SSLs).

A plurality of vertical channel structures is arranged orthogonally over, and have surfaces conformal with, the plurality of stacks, including inter-stack vertical channel structures 120 between the stacks, and linking elements 130 over the stacks connecting the inter-stack vertical channel structures 120. The linking elements 130 in this example comprise a semiconductor, such as polysilicon, having a relatively high doping concentration so that they have higher conductivity than the inter-stack vertical channel structures 120, which are configured to provide channel regions for the cells in the stacks. In the example shown in FIG. 3, the linking elements 130 of the vertical channel structures can include N+ doped semiconductor material. The inter-stack vertical channel structures 120 can include lightly doped semiconductor material. The memory device includes an overlying patterned conductive layer (not shown) connected to the plurality of vertical channel structures, including a plurality of global bit lines coupled to sensing circuits.

The memory device includes charge storage structures in interface regions at cross-points 180 between side surfaces of the conductive strips in the plurality of intermediate planes (WLs) in the stacks and the inter-stack vertical channel structures 120. In the illustrated example, the memory cells in the cross-points 180 are configured as vertical, dual-gate NAND strings, where the conductive strips on both sides of a single inter-stack vertical channel structure behave as dual-gates, and can be operated cooperatively for read, erase and program operations. In other embodiments, so called gate all around structures can be used, in which the vertical channel structures pass through horizontal strips which surround the memory layers at the corresponding frustums of the vertical channel structures. A reference conductor 160 is disposed between the bottom plane (GSL) of conductive strips and the integrated circuit substrate 101.

The memory device includes string select switches such as access transistor 190 at interface regions with the top plane of conductive strips, and reference select switches such as access transistor 170 at interface regions with the bottom plane (GSL) of conductive strips. The dielectric layers of the charge storage structure can act as gate dielectric layers for the switches 170, 190 in some examples.

In one embodiment, in order to reduce the resistance of the reference conductor 160, the memory device can include a bottom gate near the reference conductor 160. During read operations, the bottom gate can be turned on by a suitable pass voltage applied to an underlying doped well or wells in the substrate, or other underlying patterned conductor structures, to increase the conductivity of the reference conductor 160.

The memory device includes linking elements that include landing areas in the conductive strips for the horizontal word line and GSL line structures, configured for staircase contacts to overlying decoding circuits. String selection lines in the top plane of conductive strips are independently coupled to and controlled by the string selection line decoding circuits.

Conductive strips in the plurality of intermediate planes (WLs), and conductive strips in the bottom plane (GSL) are connected together to reduce decoder areas and consequently the overall size of the memory device. Conductive strips in the top plane (SSL) are individually decoded to allow correct bit line decoding.

The memory device can include linking elements, such as linking elements 141 and 142, that provide landing areas connecting sets of word lines in the intermediate planes (WL), and interlayer connectors, such as interlayer connectors 151 and 152, coupled to landing areas in the linking elements 141 and 142, where the linking elements include openings through which interlayer connectors coupled to landing areas in lower intermediate planes extend. The landing areas are at interface regions between bottom surfaces of the interlayer connectors and top surfaces of the linking elements.

As illustrated in FIG. 3, the linking element 141 provides a landing area connecting a set of word lines $WL_{N-1}$. The linking element 142 represents landing areas connecting a set of word lines $WL_0$.

As illustrated in FIG. 3, interlayer connectors for sets of word lines at multiple planes in the plurality of intermediate planes are arranged in a staircase structure. For instance, interlayer connector 151 is connected to a landing area for the intermediate plane with word lines $WL_{N-1}$. Interlayer connector 152 is connected to a landing area for the intermediate plane with word lines $WL_0$. The staircase structure can be formed in a word line decoder region near the boundary of a region for the array of NAND strings of memory cells and a region for peripheral circuits.

In the example shown in FIG. 3, the memory device includes linking elements, such as a linking element 143, connecting sets of ground selection lines in the bottom plane (GSL) of conductive strips, and interlayer connectors, such as an interlayer connector 153, coupled to landing areas in the linking elements in the bottom plane, where the interlayer connectors extend through the openings in the linking elements in the intermediate planes (WLs). The landing areas are at interface regions between bottom surfaces of the interlayer connectors, such as an interlayer connector 153, and top surfaces of the linking elements, such as a linking element 143.

Examples of vertical channel 3D NAND memory structures are described in commonly owned, and co-pending U.S. patent application Ser. No. 14/284,306, entitled "3D Independent Double Gate Flash Memory," filed 21 May 2014 by Lue, which application is incorporated by reference as if fully set forth herein. See also, U.S. Pat. No. 8,013,383 entitled Nonvolatile Semiconductor Storage Device Including a Plurality of Memory Strings, issued 6 Sep. 2011; U.S. Patent Application Publication No. 2102/0299086 entitled Semiconductor Memory Devices, published 29 Nov. 2012; and U.S. Pat. No. 8,363,476 entitled Memory Device, Manufacturing Method and Operating Method of the Same, issued 20 Jan. 2013, all of which are incorporated by reference as if fully set forth herein. As can be seen from the just cited representative references, a variety of configurations for the word line planes in vertical channel memory structures has been developed, all of which can be used in embodiments of the present technology.

Figure 4:
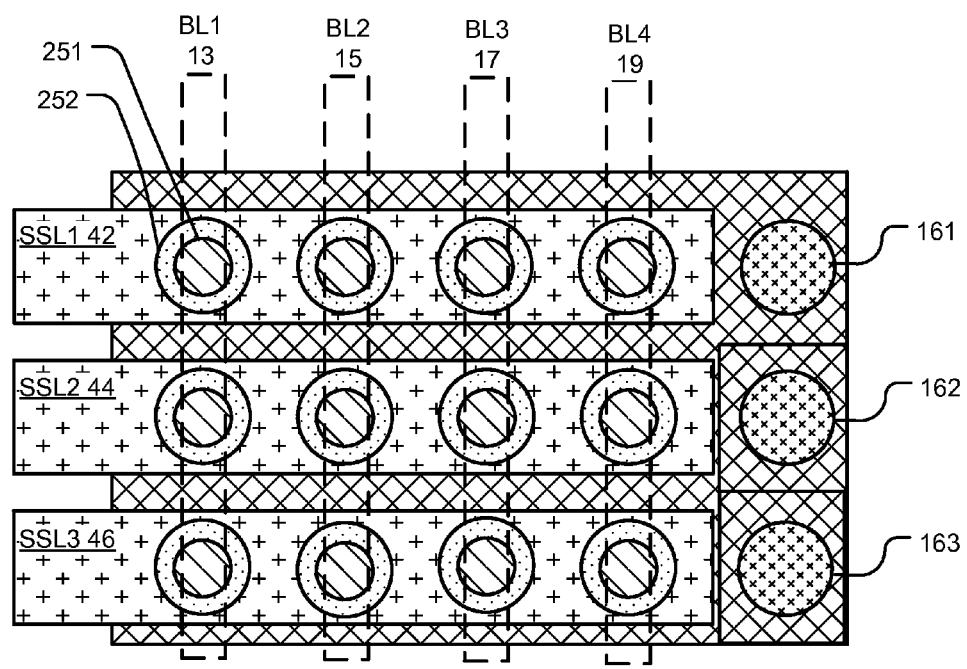
FIG. 4 is a top view of an implementation of a 3D memory device using a vertical channel structure.

FIG. 4 is a top view of an implementation of a 3D memory device using a vertical channel structure.

Multiple NAND strings of series connected memory cells are accessed by bit lines BL1 13, BL2 15, BL3 17, and BL4 19. The NAND strings have first ends connected to a page buffer via the bit lines and second ends connected to GND (not shown). The first ends of the NAND strings begin with access transistors controlled by string select lines SSL1 42, SSL2 44, and SSL3 46. The stack of word lines positioned in a particular vertical plane is selected by the corresponding string select lines SSL1 42, SSL2 44, and SSL3 46 which controls access transistors in the desired vertical plane. The second ends of the NAND strings, connected to GND 34, end with access transistors controlled by ground select line GSL 32. The different memory cells along the NAND strings are accessed by word lines WL1 23, WL2 25, WL3 27, WL4 29, which are controlled by word line decoder 21.

Different intermediate planes of word lines are selected by the interlayer connectors 161, 162, and 163 that are electrically connected to landing areas of the different intermediate planes. The memory cells in the array include vertical channel structures 251 and memory elements 252.

Figure 5:
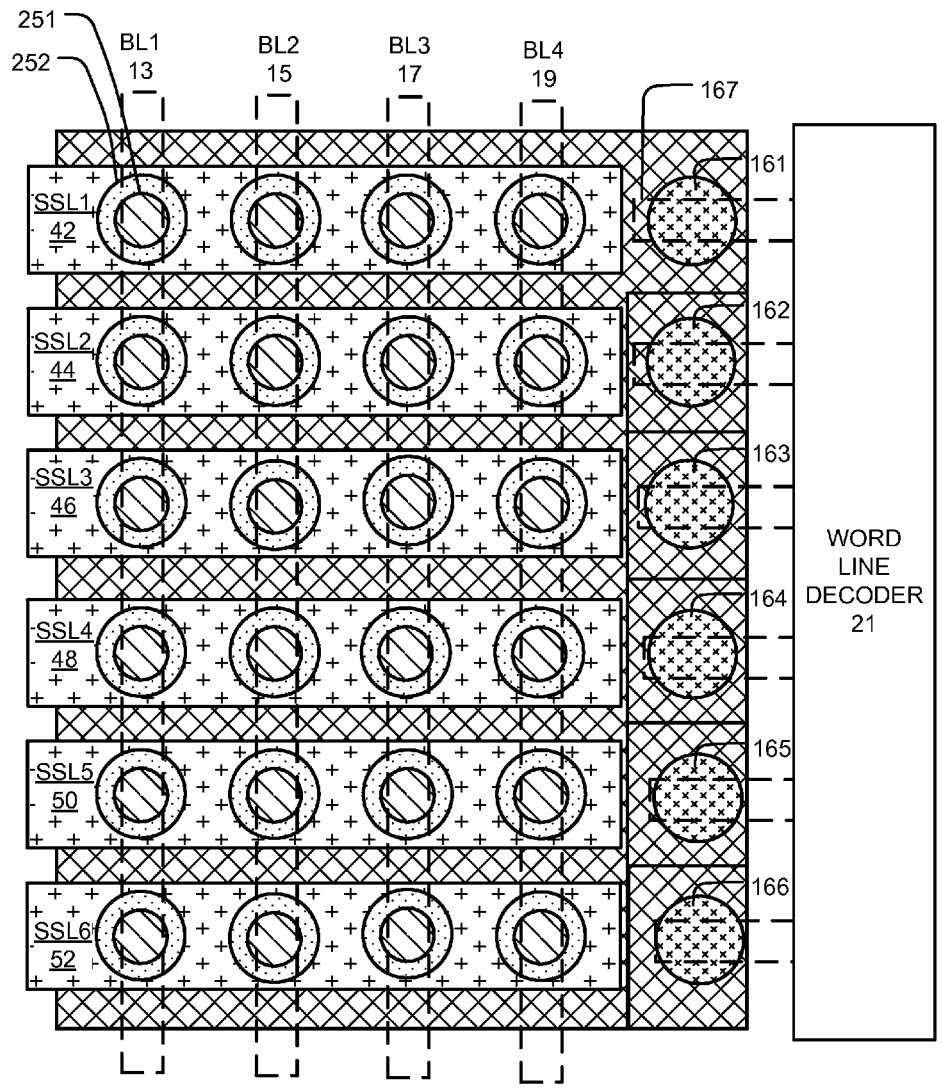
FIG. 5 is a top view of an implementation of a larger capacity 3D memory device using a vertical channel structure.

FIG. 5 is a top view of an implementation of a larger capacity 3D memory device using a vertical channel structure.

The capacity of the 3D memory device in FIG. 5 is increased relative to FIG. 4, by increasing the number of string select lines, and by increasing the number of stacks of word lines, which are positioned in an increased number of vertical planes. The set of string select lines is increased to include SSL1 42, SSL2 44, SSL3 46, SSL4 48, SSL5 50, and SSL6 52. The set of interlayer connectors is increased to include 161, 162, 163, 164, 165, and 166; the number of intermediate planes of word lines is also increased, corresponding to the number of interlayer connectors. The interlayer connectors 161, 162, 163, 164, 165, and 166 are electrically connected, by conductive lines such as conductive decoding line 167, between word line decoder 21 and landing areas of the different intermediate planes. This increased number of stacks can cause increased capacitance, noise, and power consumption relative to a 3D memory device with a smaller number of stacks such as in FIG. 4.

Figure 6:
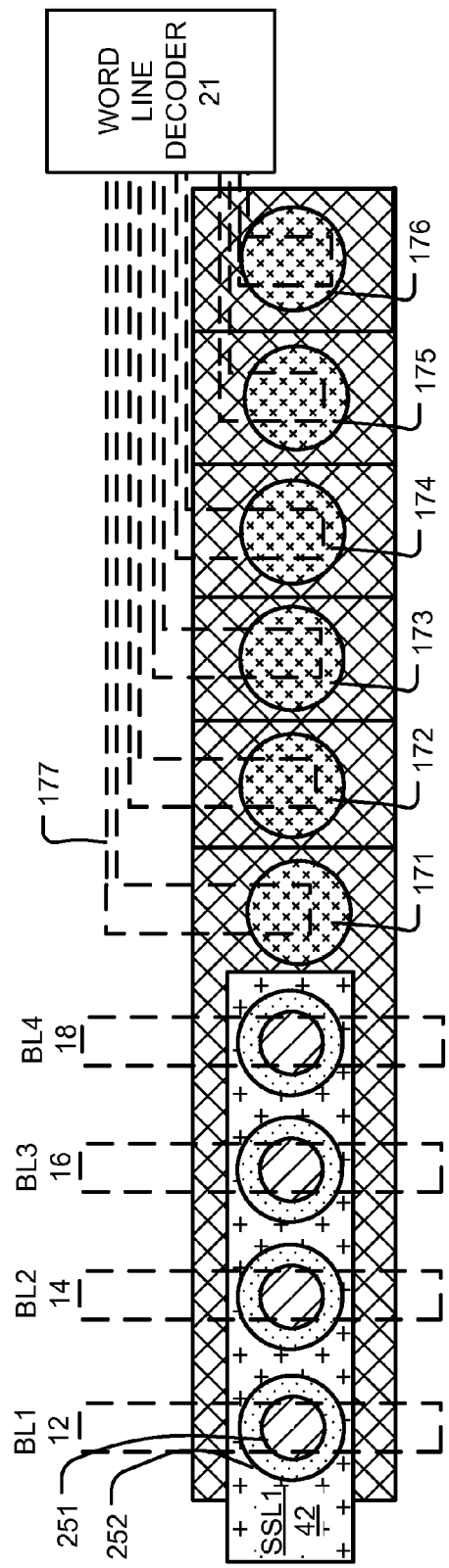
FIG. 6 is a top view of another implementation of a larger capacity 3D memory device using a vertical channel structure.

FIG. 6 is a top view of another implementation of a larger capacity 3D memory device using a vertical channel structure.

The capacity of the 3D memory device in FIG. 6 is increased relative to FIG. 4, by increasing the number of intermediate planes of word lines. The set of interlayer connectors is increased also, to include 161, 162, 163, 164, 165, and 166, corresponding to the number of interlayer connectors.

The number of interlayer connectors and the number of intermediate planes of word lines is the same between FIGS. 5 and 6. However, the number of string select lines—and the corresponding number of stacks of word lines positioned in vertical planes—are decreased. Another consequence is that the arrangement of landing areas has changed from being 1 deep and N wide, to N deep and 1 wide. In this context, depth refers to the direction along the length of the word lines, and width refers to the direction along the bit lines. The interlayer connectors 161, 162, 163, 164, 165, and 166 are electrically connected, by conductive lines 172, 173, 174, 175, 176, and 177 between word line decoder 21 and landing areas of the different intermediate planes. Because the conductive lines are crowded into a smaller space, the manufacturing process is more complicated than in FIG. 5.

Figure 7:
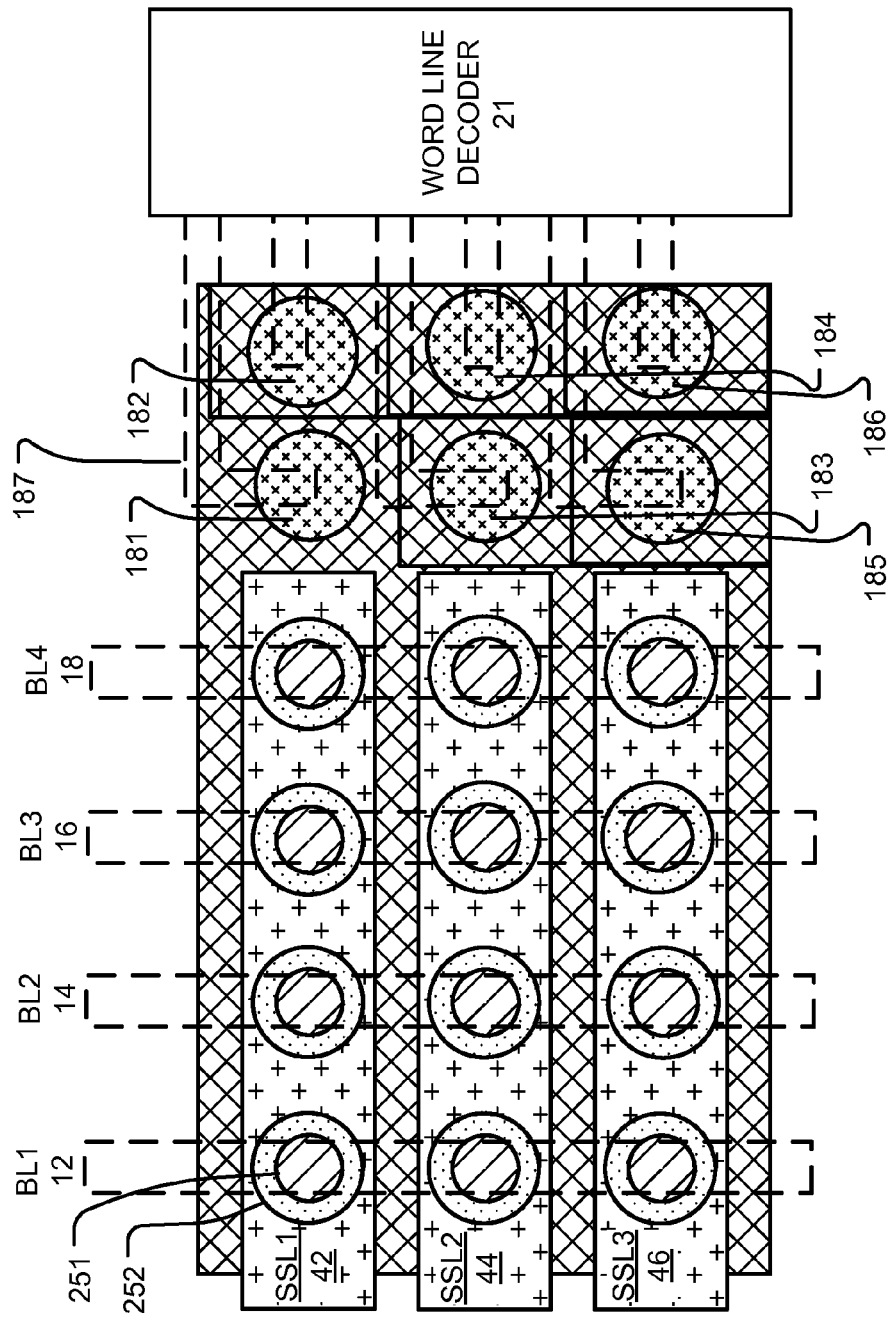
FIG. 7 is a top view of yet another implementation of a larger capacity 3D memory device using a vertical channel structure.

FIG. 7 is a top view of yet another implementation of a larger capacity 3D memory device using a vertical channel structure.

The capacity of the 3D memory device in FIG. 7 is increased relative to FIG. 4, by increasing the number of intermediate planes of word lines. The set of interlayer connectors is increased to include 181, 182, 183, 184, 185, and 186. The number of intermediate planes of word lines is also increased, corresponding to the number of interlayer connectors.

The number of interlayer connectors and the number of intermediate planes of word lines is the same among FIGS. 5, 6, and 7. However, the number of string select lines—and the corresponding number of stacks of word lines positioned in vertical planes—is in between the numbers for FIG. 5 and the numbers for FIG. 6. The arrangement of landing areas is neither 1 deep and N wide, nor N deep and 1 wide. Instead, the arrangement of landing areas is 2 deep and N/2 wide. In this context, depth refers to the direction along the length of the word lines, and width refers to the direction along the bit lines. The interlayer connectors 181, 182, 183, 184, 185, and 186 are electrically connected, by conductive lines such as conductive decoding line 187 between word line decoder 21 and landing areas of the different intermediate planes. The conductive lines are positioned into a larger space than in FIG. 6. The space is nevertheless smaller than in FIG. 5, and the manufacturing process is more complicated.

Figure 8:
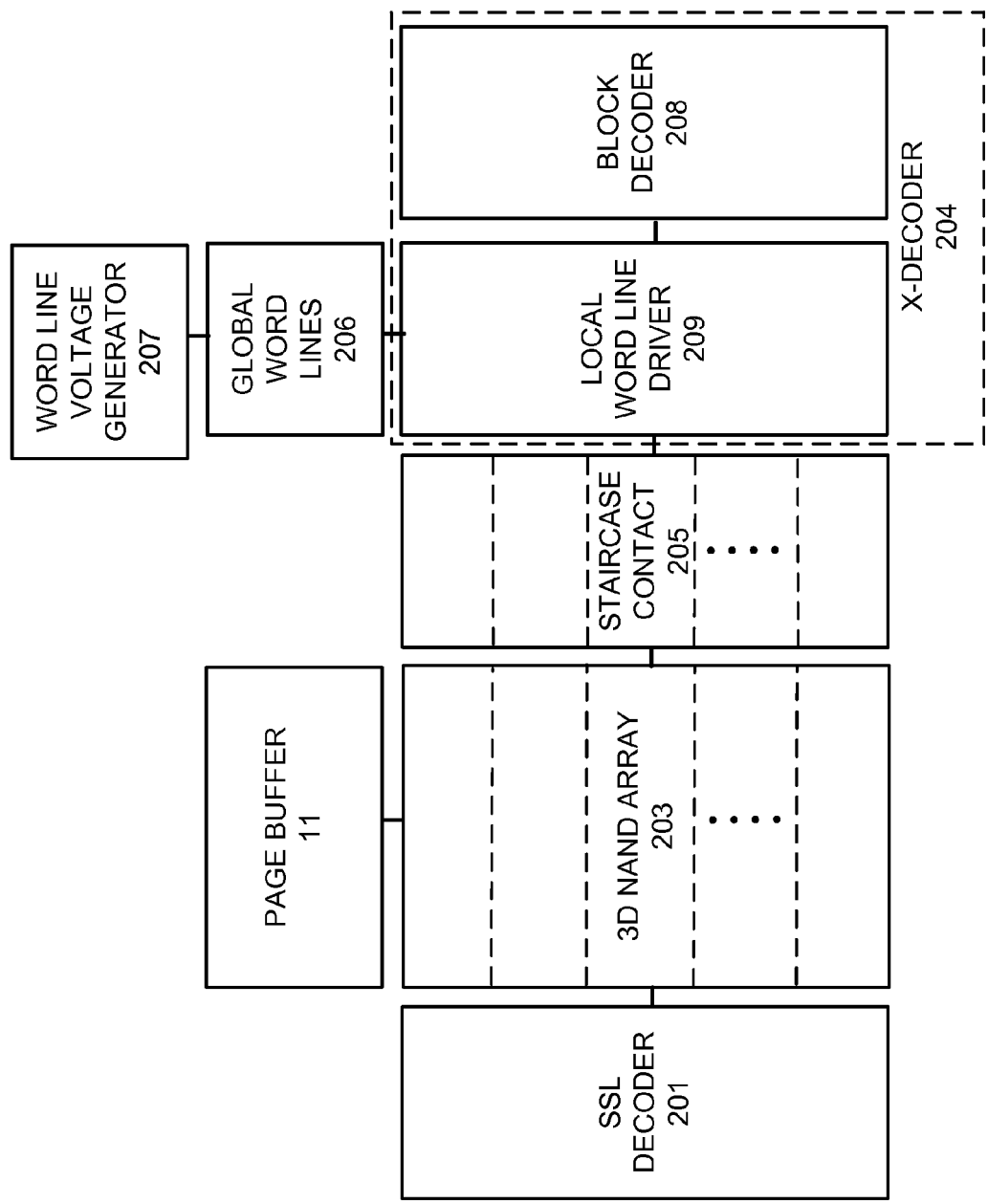
FIG. 8 is a block diagram of an implementation of a 3D memory device using a vertical channel structure.

FIG. 8 is a block diagram of an implementation of a 3D memory device using a vertical channel structure.

The 3D NAND memory array 203 includes multiple NAND strings of series connected memory cells accessed by bit lines. The NAND strings have first ends connected to page buffer 11 via the bit lines, and second ends at GND. The first ends of the NAND strings connected to the page buffer 11 have access transistors controlled by string select lines. The string select lines are controlled by SSL decoder 201. The 3D NAND array is a proximate arrangement of multiple 2D arrays. The particular 2D array in the multiple 2D arrays is selected by the corresponding string select line which controls access transistors in the desired 2D array. The different memory cells along the NAND strings are accessed by word lines which are powered by word line voltage generator 207. A layer decoder and state machine circuitry, not shown, result in the word line voltage generator 207 controlling the voltages of the different global word lines 206. For example, erase, program, and read operations will result in the word line voltage generator 207 to control the different global word lines 206 to have different sets of voltages appropriate for erase, program, and read operations. The word line voltage generator 207 is electrically coupled to local word lines of the 3D NAND memory array 203 via staircase contact 205 and local word line driver 209. The local word line driver can be switches such as transistors that electrically couple the global word lines 206 to, or decouple the global word lines 206 from, the local word lines of the 3D NAND memory array 203 via staircase contact 205. The combination of signals from the page buffer 11 to the bit lines, from the SSL decoder 201 to the string select lines, and from the word line voltage generator 207 to the local word lines via the local word line driver 209, is sufficient to uniquely identify a memory cell in the 3D NAND.

A local word line driver 209 controls switches (i.e. local word line drivers) that electrically couple the global word lines 206 to the local word lines of the 3D NAND memory array 203 via staircase contact 205. Block decoder 208 performs block decoding to electrically turn on and off groups of the switches in the local word line driver 209. Whereas the global word line driver 207 could otherwise provide power to multiple word lines in an intermediate plane, the local word line driver 209 turns on and turns off a smaller subset of word lines within the intermediate plane of word lines that could be powered by the global word lines 206.

The conductive global word lines 206 from the word line voltage generator 207 are parallel with the conductive bit lines from the page buffer 11. In the shown embodiment, the SSL decoder 201 and the X-decoder 204 are on opposite sides of the 3D NAND array 203. The X-decoder 204 can include the local word line driver 209 and the block decoder 208.

In 3D NAND array 203 and staircase contact 205, the dashed lines indicate that the different blocks are electrically decoupled from each other. Such electrical decoupling allows different block select lines to turn on only some local word lines within a particular plane of local word lines.

A block can be a minimum erase unit in NAND flash. For 2D NAND, each block has one SSL/GSL. In 3D NAND, multiple SSLs can be in a single block, which can include a GSL. Flash memory has a limited cycle lifetime; for example, one flash cell can degrade to a high failure rate after 1000 cycles of program/erase. In order to increase a memory chip life time, the data read/write in each block is balanced. With a record of bad blocks, the good blocks can still be used. A minimum unit for such techniques is a block. In 2D NAND, block size=$N_{BL}*N_{WL}$. In 3D NAND, block size=$N_{BL}*N_{WL}*N_{SSL}$. $N_{BL}$=number of BL (in a block). $N_{WL}$=number of WL (in a block). $N_{SSL}$=number of SSL (in a block).

Figure 9:
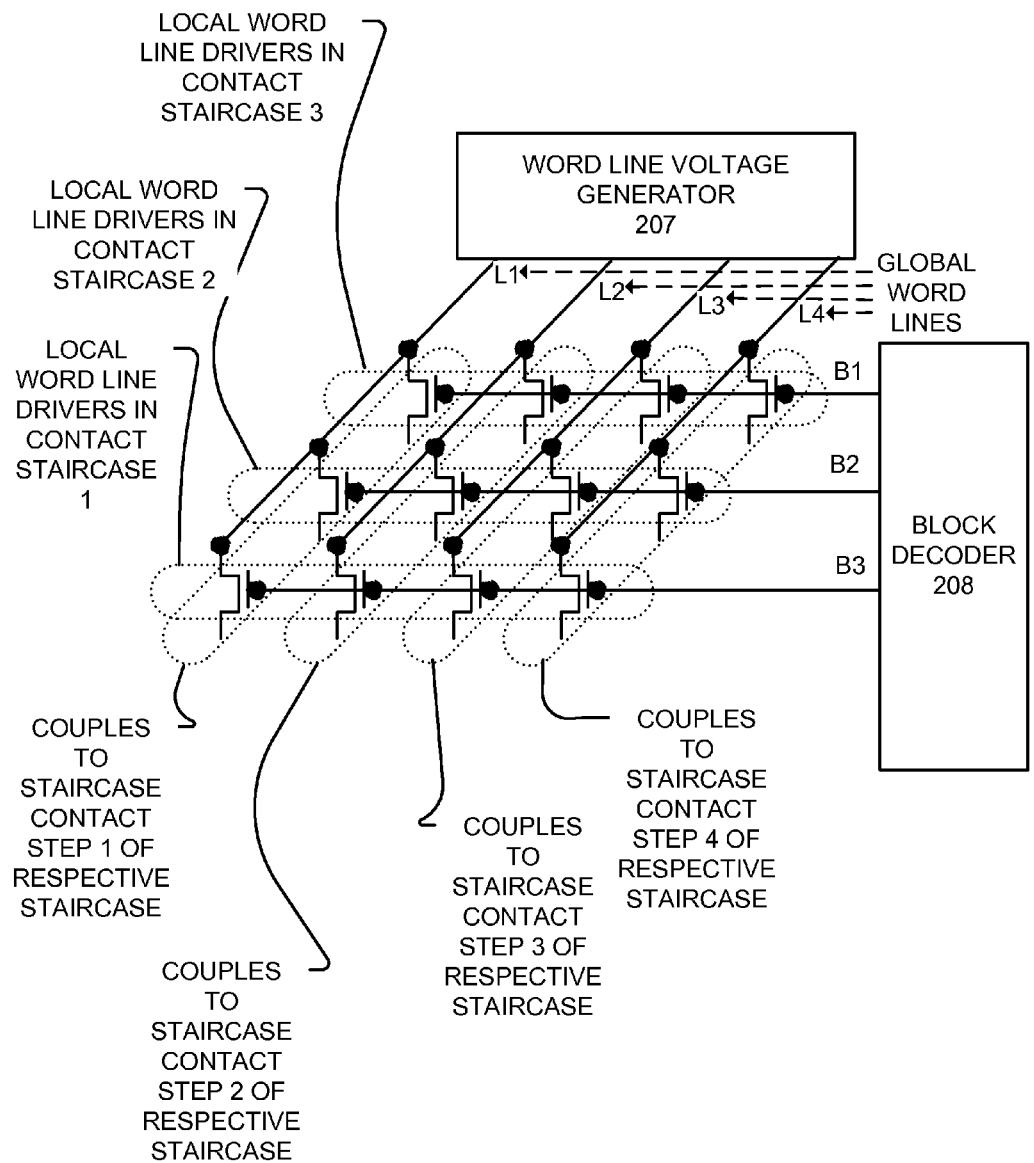
FIG. 9 is a simplified circuit diagram of pass transistors that are proximate to the staircase contacts of the 3D memory device of FIG. 8.

FIG. 9 is a simplified circuit diagram of pass transistors that are proximate to the staircase contacts of the 3D memory device of FIG. 8.

Word line voltage generator 207 controls the different global word lines shown as conductive lines L1, L2, L3, and L4, to have different sets of voltages appropriate for erase, program, and read operations.

The different global word lines L1, L2, L3, and L4 respectively turn on and off different planes of word lines. L1 electrically connects to staircase step 1 of the respective staircase. L2 electrically connects to staircase step 2 of the respective staircase. L3 electrically connects to staircase step 3 of the respective staircase. L4 electrically connects to staircase step 4 of the respective staircase. The different steps of the respective staircase in turn are electrically coupled to different intermediate planes of word lines. As discussed below, the respective staircase can be any set of staircase contacts controlled by a distinct block select signal.

The block decoder 208 controls transistors acting as word line drivers that switch whether or not the global word lines' signals reach the corresponding staircase contact and then the corresponding intermediate plane of local word lines. Block decoder 208 generates signals carried by conductive block select lines B1, B2, and B3, which respectively turn on and off particular blocks of word line drivers that then turn on and off local word lines within each intermediate plane of local word lines. Conductive block select lines B1, B2, and B3 each control a row of word line driver transistors that lead to a different staircase of contacts. The different staircases of contacts are electrically decoupled from each other. Conductive line B1 controls a row of word line driver transistors that lead to contact staircase 1. Conductive line B2 controls a row of word line driver transistors that lead to contact staircase 2. Conductive line B1 controls a row of word line driver transistors that lead to contact staircase 3. Contact staircases 1, 2, and 3 are electrically decoupled from each other.

Figure 10:
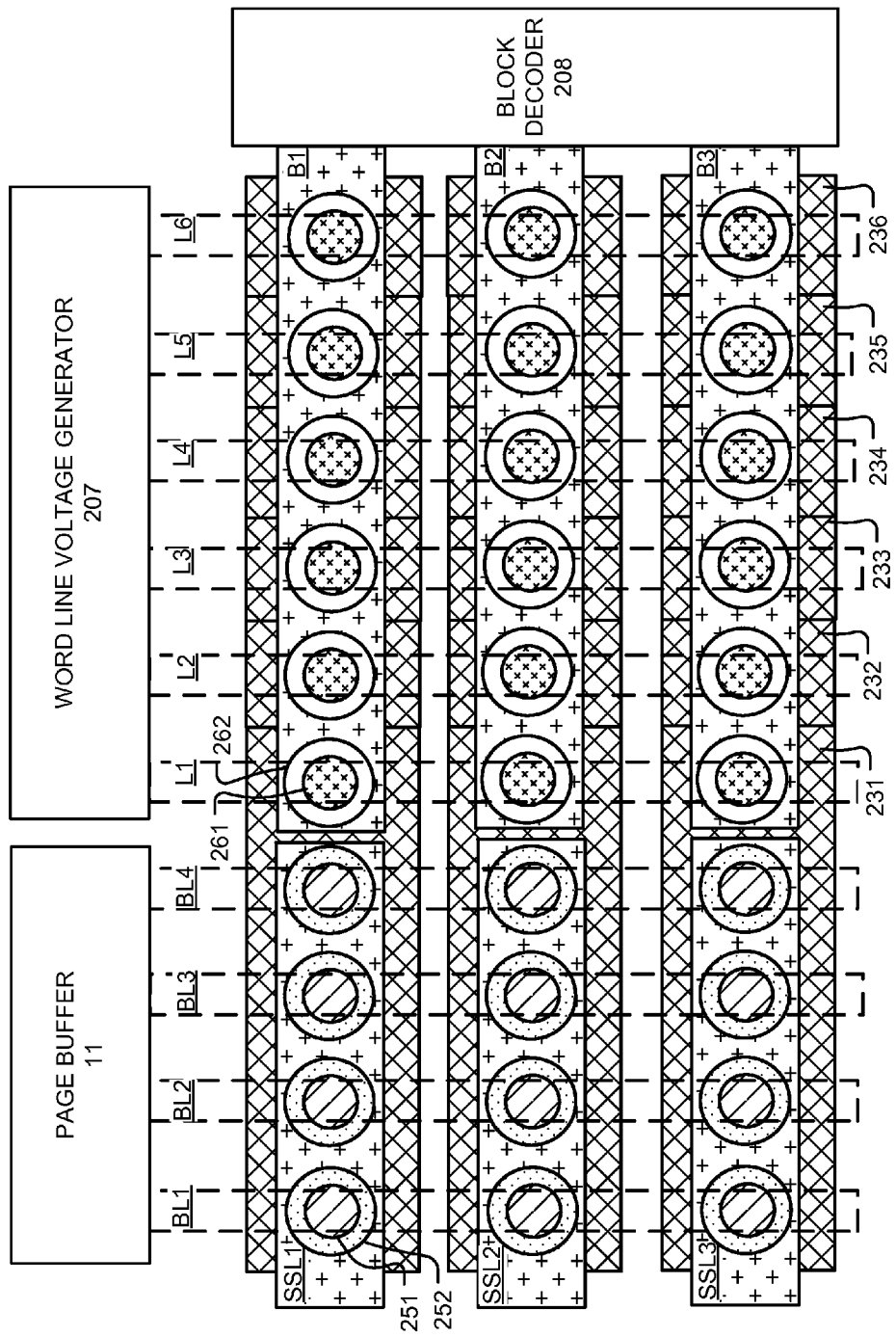
FIG. 10 is a top view of a 3D memory device using a vertical channel structure with pass transistors that turn on particular word lines associated with a string select line of the 3D memory device.

FIG. 10 is a top view of a 3D memory device using a vertical channel structure with pass transistors that turn on particular word lines associated with a string select line of the 3D memory device.

Word line voltage generator 207 generates signals carried by conductive global word lines L1, L2, L3, L4, L5, and L6, which respectively turn on and off different planes of local word lines. L1 electrically connects to staircase step 231 of the respective staircases. L2 electrically connects to staircase step 232 of the respective staircases. L3 electrically connects to staircase step 233 of the respective staircases. L4 electrically connects to staircase step 234 of the respective staircases. L5 electrically connects to staircase step 235 of the respective staircases. L6 electrically connects to staircase step 236 of the respective staircases.

The block decoder 209 controls word line driver transistors that switch whether or not the global word lines' signals reach the corresponding staircase contact and in turn the corresponding intermediate plane of local word lines. For example, the word line driver transistor at the intersection of conductive lines B1 and L1 has a so called gate all around structure, with vertical channel structure 261 passing through dielectric 262 which surrounds the vertical channel structure 261. Block decoder 209 generates signals carried by conductive lines B1, B2, and B3, which respectively turn on and off particular word line driver transistors, that in turn results in turning on and off particular blocks of local word lines within each intermediate plane of word lines.

The memory cells in the array include vertical channel structures 251 and memory elements 252. Vertical channel structures can comprise semiconductor materials adapted to act as channels for the memory elements, such materials as Si, Ge, SiGE, GaAs, SiC, and Graphene. Memory elements in the memory device can include charge storage structures, such as multilayer dielectric charge trapping structures known from flash memory technologies as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

Multiple NAND strings of series connected memory cells are accessed by bit lines BL1, BL2, BL3, and BL4. The bit lines select memory cells at different positions along the local word lines. The same bit lines select memory cells along the local word lines of different intermediate planes. The NAND strings have first ends connected to page buffer 11 via the bit lines. The NAND strings have second ends at GND. The first ends of the NAND strings connected to the page buffer 11 have access transistors controlled by string select lines SSL1, SSL2, and SSL3. The second ends of the NAND strings, connected to GND, have access transistors controlled by ground select line GSL.

A first set of NAND strings are turned on and off by SSL1. The local word lines of transistors in the first set of NAND strings are turned on and off by word line drivers controlled by B1. A second set of NAND strings are turned on and off by SSL2. The word lines of transistors in the second set of NAND strings are turned on and off by word line drivers controlled by B2. A third set of NAND strings are turned on and off by SSL3. The word lines of transistors in the third set of NAND strings are turned on and off by word line drivers controlled by B3.

As a result, even if the word line voltage generator 207 generates global word line voltages that could be coupled to multiple local word lines in a same intermediate plane, the block decoder 208 can turn on only a selected subset of the local word line driver transistors, and thereby can turn on only a selected subset of the multiple local word lines in the same intermediate plane. For example, word line voltage generator 207 can use conductive global word line L1 to select initially the multiple local word lines in the top intermediate plane via staircase steps 231. Out of these multiple local word lines, conductive decoding line B1 turns on only the local word line drivers for local word lines of transistors in NAND strings where such NAND strings are turned on and off by SSL1, conductive decoding line B2 turns on only the local word line drivers for local word lines of transistors in NAND strings where such NAND strings are turned on and off by SSL2, and conductive decoding line B3 turns on only the local word line drivers for local word lines of transistors in NAND strings where such NAND strings are turned on and off by SSL3.

The layer select lines are routed in parallel to the bit lines. SSL lines define vertical pitch. Bit lines and layer select lines define horizontal pitch. The block select lines can be the same quantity, or fewer, than the SSL lines.

Figure 11:
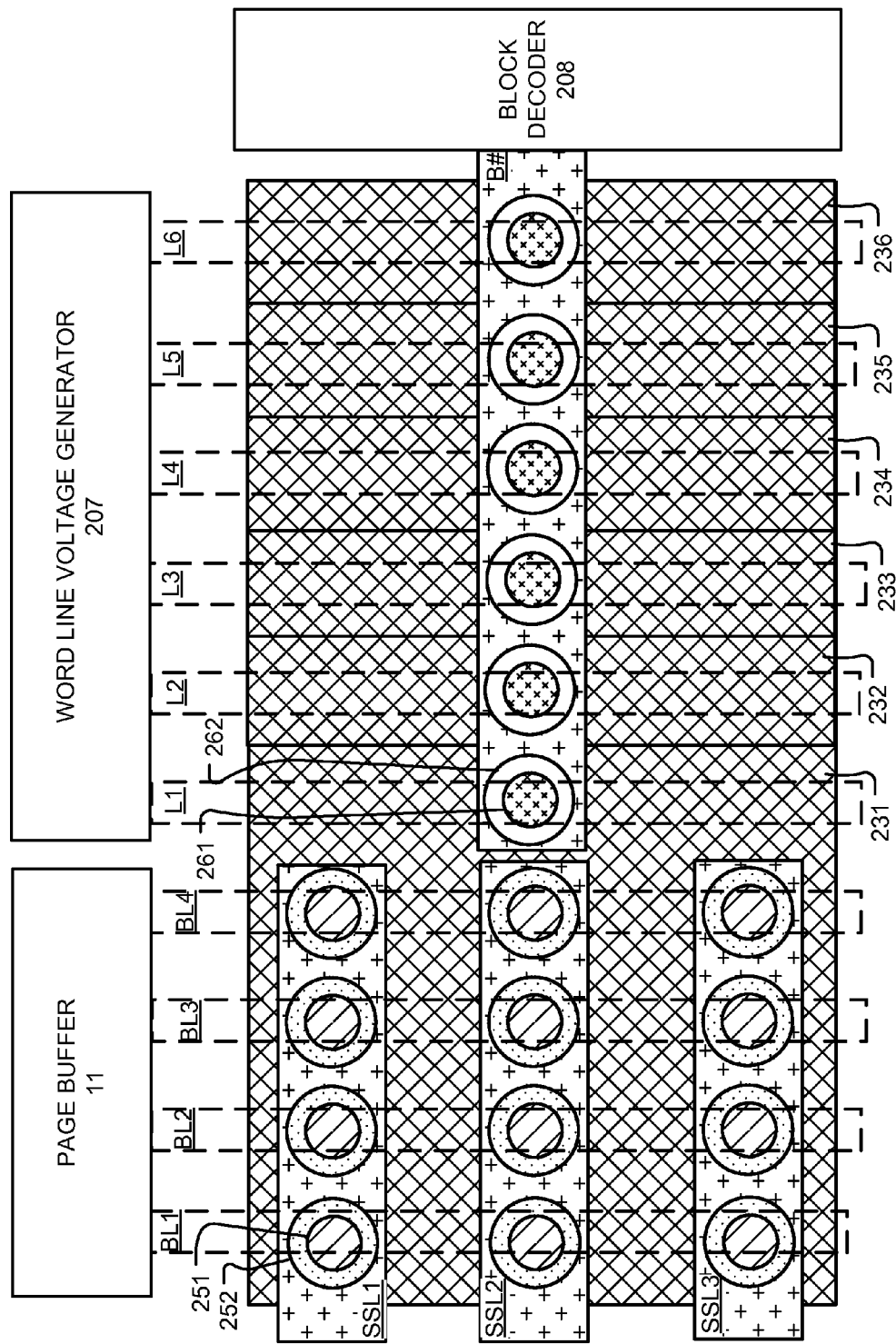
FIG. 11 is a top view of a 3D memory device using a vertical channel structure with pass transistors that turn on particular word lines associated with multiple string select lines of the 3D memory device.

FIG. 11 is a top view of a 3D memory device using a vertical channel structure with pass transistors that turn on particular word lines associated with multiple string select lines of the 3D memory device.

The arrangement of the 3D memory device is similar between FIGS. 10 and 11. However, in FIG. 11 block decoder 208 generates signals carried by conductive decoding line B#, which turns on and off particular word line driver transistors for a particular block of word lines corresponding to multiple string select lines. In FIG. 11 the word lines of transistors in NAND strings are all turned on and off by word line driver transistors controlled by B#, where such NAND strings are turned on and off by SSL1, SSL2, and SSL3. By contrast, in FIG. 10 block decoder 208 generates signals carried by conductive lines B1, B2, and B3 respectively turn on and off word line driver transistors for a particular block of word lines corresponding to one string select line. Other embodiments can be directed to block conductive lines that turn on and off word line driver transistors for a block of word lines corresponding to other numbers of string select lines.

Figure 12:
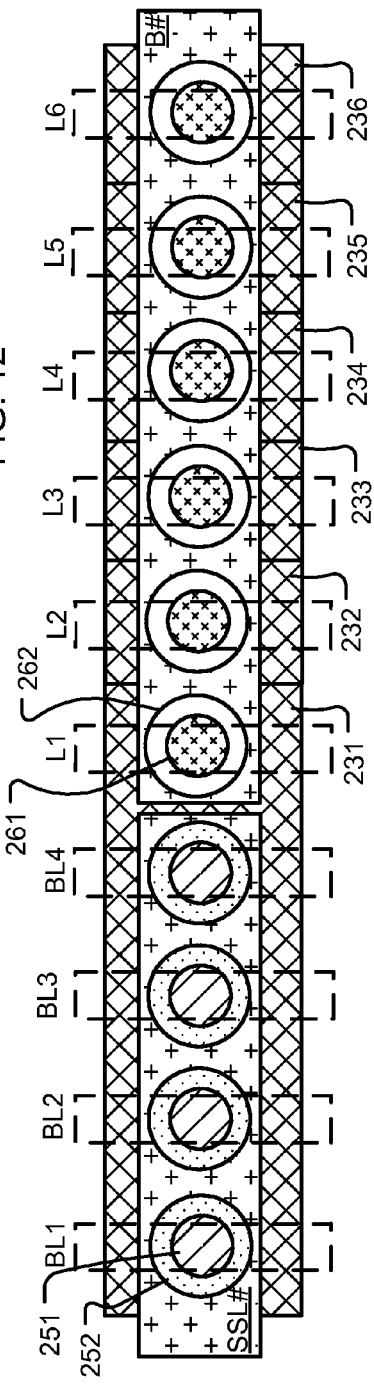
FIGS. 12 and 13 illustrate a top view and a side view respectively of a 3D memory device using a vertical channel structure with pass transistors that turn on a particular set of word lines associated with a string select line of the 3D memory device.
Figure 13:
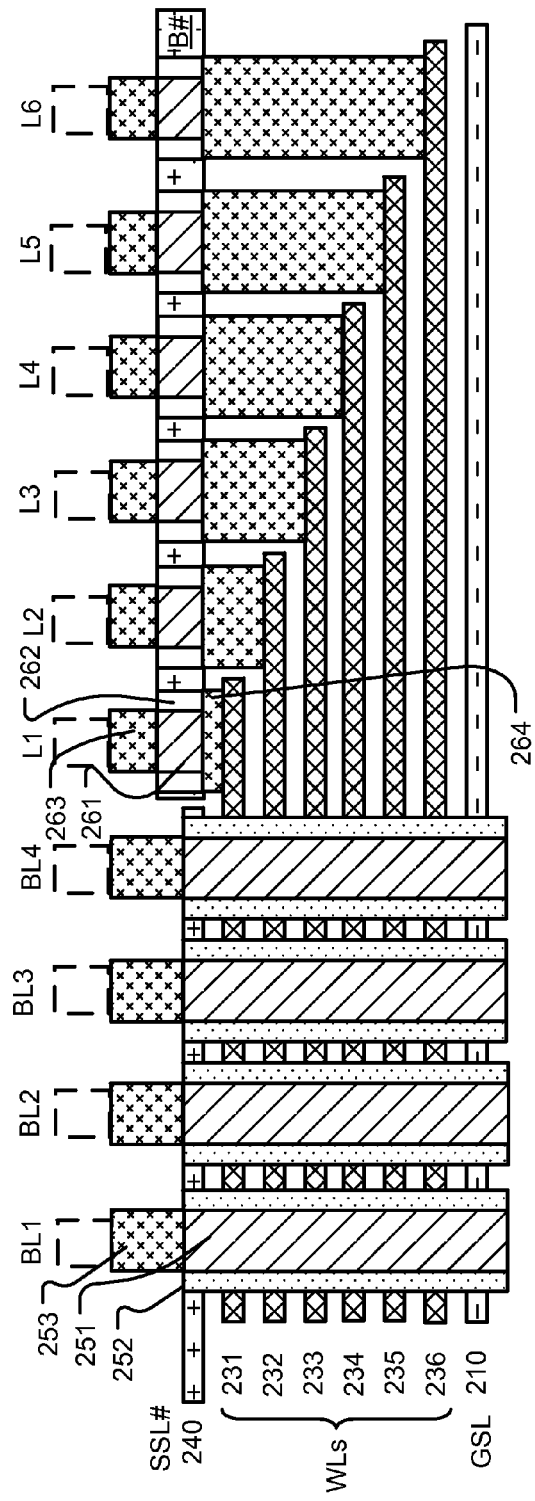

FIGS. 12 and 13 illustrate a top view and a side view respectively of a 3D memory device using a vertical channel structure with pass transistors that turn on a particular set of word lines associated with a string select line of the 3D memory device.

Parts of the different 3D memory devices in FIGS. 10 and 11 are shown in additional detail in FIGS. 12 and 13. FIGS. 12 and 13 show in more detail an example of part of the 3D memory device in FIG. 10 corresponding to a single string select line and a single block select line, such as SSL1 and B1, or SSL2 and B2, or SSL3 and B3. FIGS. 12 and 13 also show in more detail an example of the central part of the 3D memory device in FIG. 11 corresponding to a single string select line and a single block select line, such as SSL2 and B#.

Conductive global word lines L1, L2, L3, L4, L5, and L6, respectively turn on and off different planes of local word lines 231, 232, 233, 234, 235, and 236. Conductive global word lines L1, L2, L3, L4, L5, and L6 carry signals generated by the word line voltage generator to respective intermediate planes of local word lines 231, 232, 233, 234, 235, and 236.

L1 electrically connects via a word line driver transistor to staircase step 231 of the staircase contact. L2 electrically connects via a word line driver transistor to staircase step 232 of the staircase contact. L3 electrically connects via a word line driver transistor to staircase step 233 of the staircase contact. L4 electrically connects via a word line driver transistor to staircase step 234 of the staircase contact. L5 electrically connects via a word line driver transistor to staircase step 235 of the staircase contact. L6 electrically connects via a word line driver transistor to staircase step 236 of the staircase contact.

A block decoder line such as conductive decoding line B# carries signals from the block decoder to control word line driver transistors that switch whether or not the global word lines' signals reach the corresponding staircase contacts and in turn the corresponding intermediate planes of local word lines. For example, the word line driver transistor at the intersection of conductive lines B# and L1 has a so called gate all around structure, with vertical channel structure 261 passing through dielectric 262 which surrounds the vertical channel structure 261. The vertical channel structure 261 of this word line driver transistor is electrically coupled to global word line L1 and local word line plane 231 by respective conductive plugs 263 and 264. The intersections between B# and the other global word lines L2, L3, L4, L5, and L6 also have corresponding word line driver transistors with the gate all around structure.

Conductive decoding line B# carries signals from the block decoder which turns on and off the block B# of word line driver transistors and then the local word lines within each intermediate plane of local word lines. B# turns on and off the word line driver transistor electrically coupling global word line L1 to the staircase contact of the intermediate plane of local word lines 231, the word line driver transistor electrically coupling global word line L2 to the staircase contact of the intermediate plane of local word lines 232, the word line driver transistor electrically coupling global word line L3 to the staircase contact of the intermediate plane of local word lines 233, the word line driver transistor electrically coupling global word line L4 to the staircase contact of the intermediate plane of local word lines 234, the word line driver transistor electrically coupling global word line L5 to the staircase contact of the intermediate plane of local word lines 235, and the word line driver transistor electrically coupling global word line L6 to the staircase contact of the intermediate plane of local word lines 236.

The memory cells in the array include vertical channel structures 251 and memory elements 252 accessed by bit line BL1. The other bit lines BL2, BL3, and BL4 also access similar memory cells in the array including vertical channel structures and memory elements. Multiple NAND strings of series connected memory cells are accessed by bit lines BL1, BL2, BL3, and BL4. The bit lines select memory cells at different positions along the intermediate planes of word lines 231, 232, 233, 234, 235, and 236.

The same bit lines select memory cells along the word lines of different intermediate planes. The NAND strings have first ends connected to a page buffer via the bit lines BL1, BL2, BL3, and BL4. The NAND strings have second ends at GND via GSL 210. The first ends of the NAND strings connected to the page buffer have access transistors controlled by string select line SSL#240. The second ends of the NAND strings have access transistors controlled by GSL ground select line plane 210, electrically coupling the NAND strings to GND.

A set of NAND strings are turned on and off by SSL#. The word lines of transistors in the set of NAND strings are turned on and off by word line driver transistors controlled by B#.

As a result, even if the word line voltage generator 207 generates global word line voltages that could be coupled to multiple local word lines in a same intermediate plane, the block decoder 208 can turn on only a selected subset of the local word line driver transistors, and thereby can turn on only a selected subset of the multiple local word lines in the same intermediate plane. For example, word line voltage generator 207 can use conductive global word line L1 to select initially the multiple local word lines in the top intermediate plane via staircase step 231. Out of these multiple local word lines, conductive decoding line B# turns on only the local word line drivers for local word lines of transistors in NAND strings where such NAND strings are turned on and off by SSL#.

Figure 14:
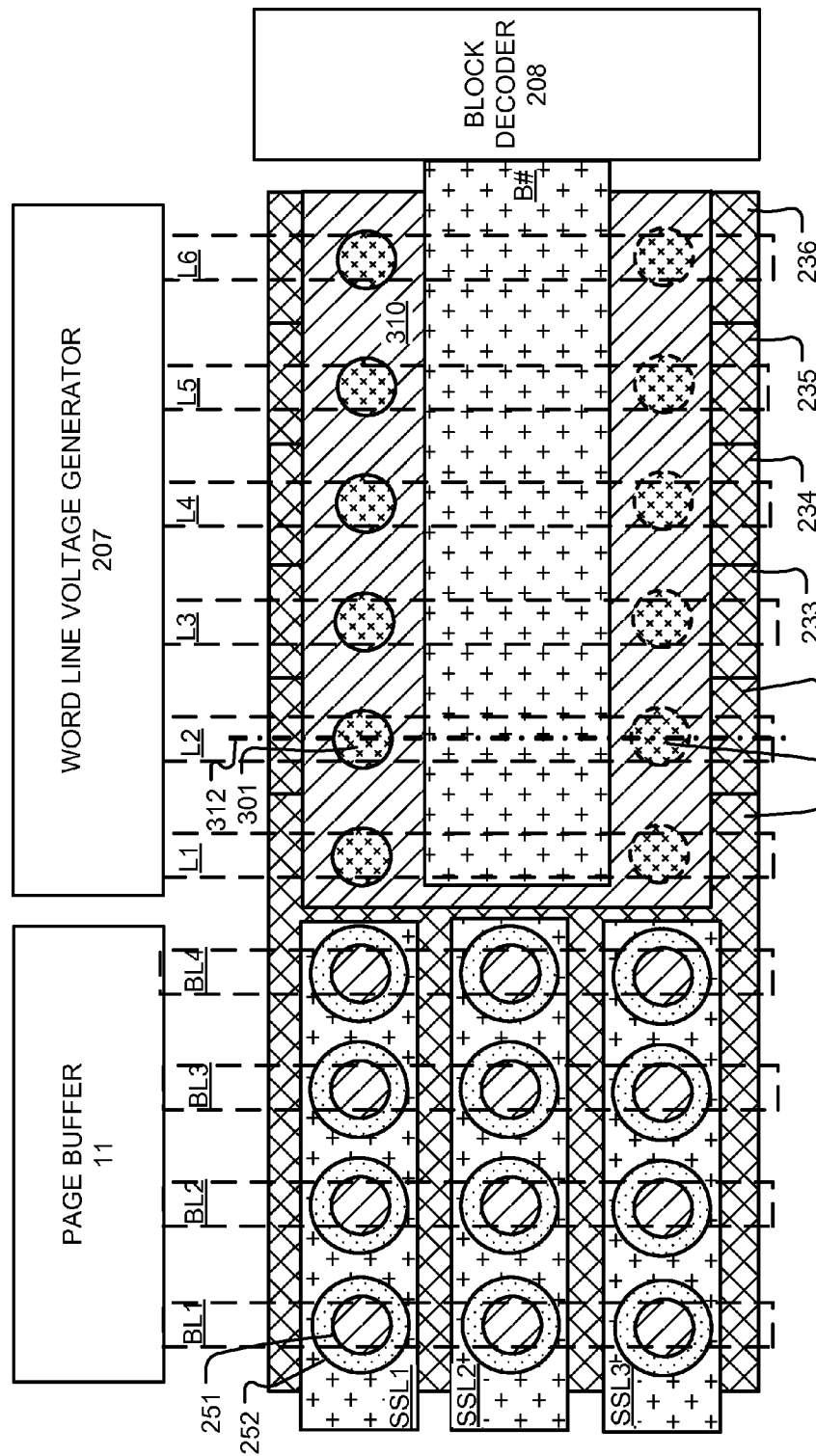
FIGS. 14 and 15 illustrate a top view and a cross-sectional respectively of a 3D memory device using a vertical channel structure with thin film pass transistors that turn on word lines associated with multiple string select lines of the 3D memory device.
Figure 15:
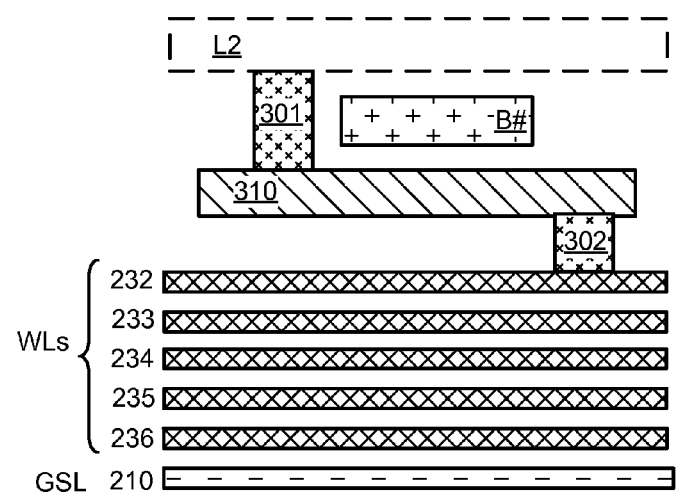

FIGS. 14 and 15 illustrate a top view and a cross-sectional view respectively of a 3D memory device using a vertical channel structure with thin film pass transistors that turn on word lines associated with multiple string select lines of the 3D memory device.

FIG. 14 has the cross-sectional line 312 to indicate the position of the cross-sectional view of FIG. 15.

The 3D memory device of FIG. 14 has some similarity to the 3D memory device of FIG. 11, in that the word lines of memory cells in NAND strings are turned on and off by block decoder line B#, where such NAND strings are turned on and off by SSL1, SSL2, and SSL3. However, the transistors controlled by the block select line B# in FIG. 11 have a gate all around structure, whereas the transistors controlled by the block select line B# in FIG. 14 are thin film transistors.

Conductive global word lines L1, L2, L3, L4, L5, and L6 carry signals generated by the word line voltage generator 207 via elements described below to respective intermediate planes of local word lines 231, 232, 233, 234, 235, and 236. Conductive global word lines L1, L2, L3, L4, L5, and L6 are electrically coupled to conductive plugs such as conductive plug 301. The conductive plugs such as conductive plug 301 are electrically coupled to a first end of horizontal channel structure 310. The row of conductive plugs including conductive plug 301 shows the conductive plugs with unbroken lines to indicate that, in the top view of FIG. 14, the row of conductive plugs including conductive plug 301 is positioned above the horizontal channel structure 310. Horizontal channel structure 310 can be made of the same material as vertical channel structure 251. Alternatively, horizontal channel structure 310 and vertical channel structure 251 can be made of different channel materials. A second end of horizontal channel structure 310 is electrically coupled to conductive plugs such as conductive plug 302. The row of conductive plugs including conductive plug 302 shows the conductive plugs with dashed lines to indicate that, in the top view of FIG. 14, the row of conductive plugs including conductive plug 302 is positioned below the horizontal channel structure 310.

FIG. 15 explicitly shows conductive plug 301 positioned above the horizontal channel structure 310, and conductive plug 302 positioned below the horizontal channel structure 310.

Within the row of conductive plugs including conductive plug 302, the conductive plug aligned with global word line L1 electrically connects to staircase step 231 of the staircase contact, the conductive plug aligned with global word line L2 electrically connects to staircase step 232 of the staircase contact, the conductive plug aligned with global word line L3 electrically connects to staircase step 233 of the staircase contact, the conductive plug aligned with global word line L4 electrically connects to staircase step 234 of the staircase contact, the conductive plug aligned with global word line L5 electrically connects to staircase step 235 of the staircase contact, and the conductive plug aligned with global word line L6 electrically connects to staircase step 236 of the staircase contact.

FIG. 15 does not show staircase step 231 of the staircase contact, because staircase step 231 terminated in the region of global word line L1. A similar cross-section positioned at global word line L1 of FIG. 14 would show additional staircase step 231 above staircase step 232, and the second end of horizontal channel structure 310 electrically coupled to staircase step 231, instead of staircase step 232, via shorter conductive plug 302. A similar cross-section positioned at global word line L3 of FIG. 14 would omit staircase steps 231 and 232, and the second end of horizontal channel structure 310 electrically coupled to staircase step 233 via longer conductive plug 302. A similar cross-section positioned at global word line L4 of FIG. 14 would omit staircase steps 231-233, and the second end of horizontal channel structure 310 electrically coupled to staircase step 234 via longer conductive plug 302. A similar cross-section positioned at global word line L5 of FIG. 14 would omit staircase steps 231-234, and the second end of horizontal channel structure 310 electrically coupled to staircase step 235 via longer conductive plug 302. A similar cross-section positioned at global word line L6 of FIG. 14 would omit staircase steps 231-235, and the second end of horizontal channel structure 310 electrically coupled to staircase step 236 via longer conductive plug 302.

Figure 16:
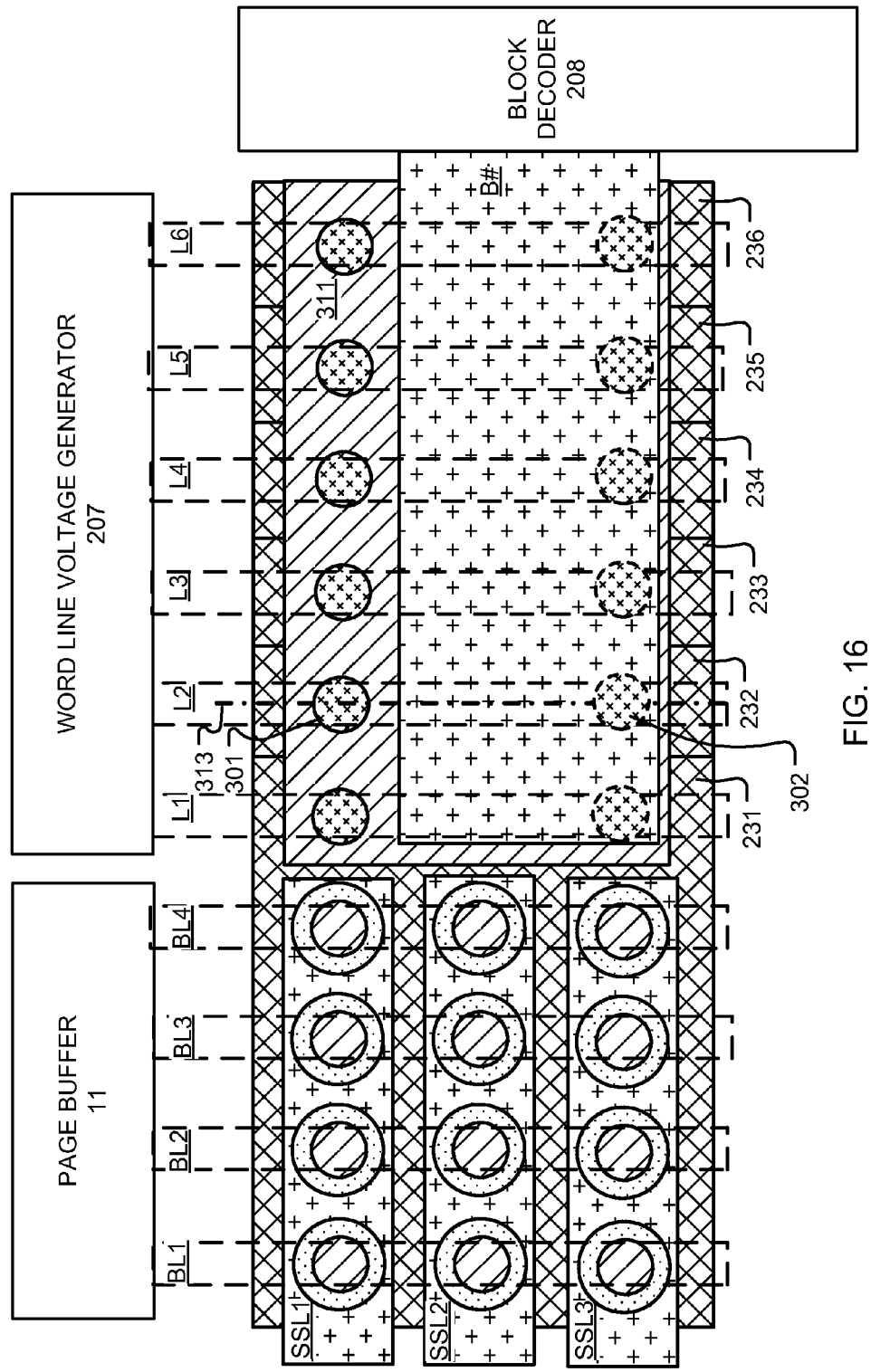
FIGS. 16 and 17 illustrate a top view and a cross-sectional respectively of another 3D memory device using a vertical channel structure with thin film pass transistors that turn on word lines associated with multiple string select lines of the 3D memory device.
Figure 17:
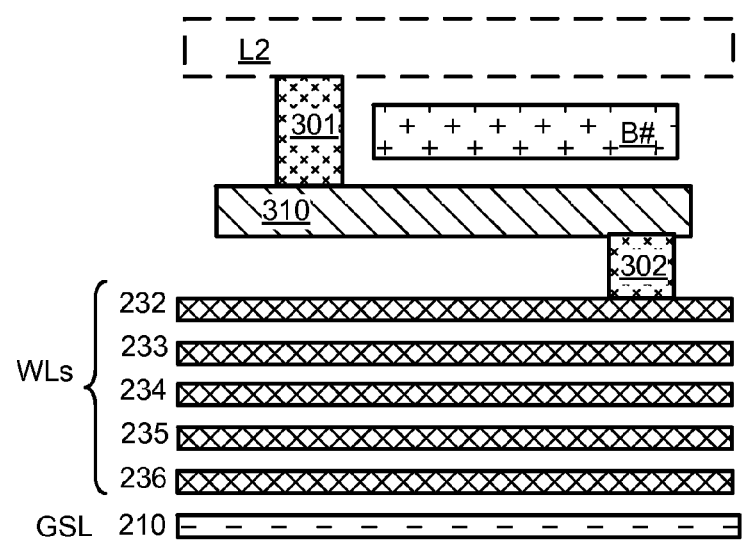

FIGS. 16 and 17 illustrate a top view and a cross-sectional respectively of another 3D memory device using a vertical channel structure with thin film pass transistors that turn on word lines associated with multiple string select lines of the 3D memory device.

The 3D memory device of FIGS. 16-17 has some similarity to the 3D memory device of FIGS. 14-15. However, in FIGS. 14-15 the horizontal channel structure 310 does not laterally extend over the row of conductive plugs including conductive plug 302; in FIGS. 14-15 the lateral extent of the horizontal channel structure 310 stops short of the row of conductive plugs including conductive plug 302. By contrast, in FIGS. 16-17 the horizontal channel structure 310 laterally extends over the row of conductive plugs including conductive plug 302.

In yet other embodiments, the block decoder-controlled word line driver transistors are substrate devices, or long channel devices with a channel over 1.5 um in length.

Figure 18:
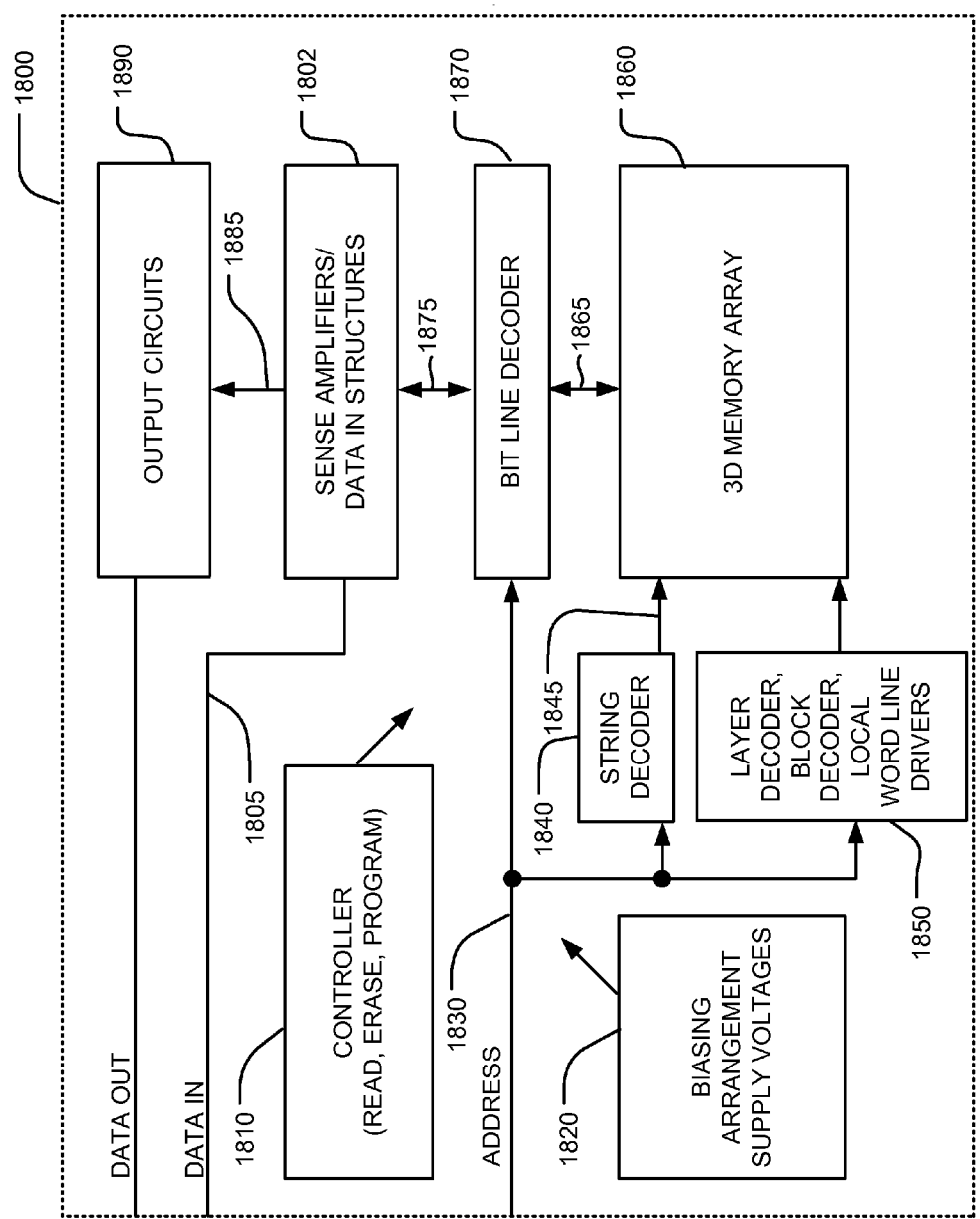
FIG. 18 is a simplified chip block diagram of an integrated circuit memory according to an embodiment of the technology.

FIG. 18 is a simplified chip block diagram of an integrated circuit memory according to an embodiment of the technology.

The integrated circuit 1800 includes a 3D memory array 1860 on an integrated circuit substrate.

A string decoder 1840 is coupled to a plurality of word line planes, and the string select and ground select planes 1845 in the memory array 1860. A bit line decoder 1870 is coupled to a plurality of bit lines 1865 in the memory array 1860 for reading and programming data from the memory cells in the memory array 1860. In block 1850, a block decoder 1850 is coupled to a plurality of blocks of word line driver switches such as transistor that can electrically couple and decouple global word lines to local word lines in the memory array 1860. Also in 1850, a layer decoder controls the program, erase, and read voltages provided to the global word lines. Addresses are supplied on bus 1830 to decoder 1870, decoder 1840 and block 1850. Sense amplifiers and data-in structures in block 1802 are coupled to the bit line decoder 1870, in this example via data bus 1875. Sensed data from the sense amplifiers are supplied via output data lines 1885 to output circuits 1890. Output circuits 1890 drive the sensed data to destinations external to the integrated circuit 1800. Input data is supplied via the data-in line 1805 from input/output ports on the integrated circuit 1800 or from other data sources internal or external to the integrated circuit 1800, such as a general purpose processor or special purpose application circuitry, or a combination of modules providing system-on-a-chip functionality supported by the 3D memory array 1860, to the data-in structures in block 1880.

In the example shown in FIG. 18, a controller 1810 using a bias arrangement state machine controls the application of bias arrangement supply voltage generated or provided through the voltage supply or supplies in block 1820, such as read and program voltages. The controller 1810 can include modes of operation for multi-level cell (MLC) programming and reading. The controller 1810 can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

The integrated circuit 1800 can support word line driver switches such as transistors controlled by a block decoder to turn word lines on and off. The memory array 1860 can include a first plurality of conductive lines electrically coupled to the top layer of the conductive strips to select at least a first particular stack in the plurality of stacks, according to a decoder such as a string select line decoder. The memory array 1860 can include a second plurality of conductive lines electrically coupled to the plurality of intermediate layers to select at least the first particular stack in the plurality of stacks, according to a decoder such as a block decoder. The memory array 1860 can include a third plurality of conductive lines electrically coupled to the plurality of intermediate layers to select at least at least one particular layer in the plurality of intermediate layers, according to a decoder such as a layer decoder.

In some embodiments, the SSL lines are twisted, such that multiple sets of separately addressed SSL lines can access the array. In some embodiments, the bit lines are twisted, such that multiple sets of separately addressed bit lines can access the array.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a plurality of stacks of conductive strips alternating with insulating strips, including at least a bottom layer of conductive strips, a plurality of intermediate layers of conductive strips, and a top layer of conductive strips;
   a plurality of semiconductive vertical structures arranged orthogonally to the plurality of stacks;
   memory elements in interface regions at cross-points between side surfaces of the plurality of stacks and the plurality of semiconductive vertical structures;
   a first plurality of conductive lines controlling a plurality of transistor switches at the top layer of the conductive strips;
   a second plurality of conductive lines;
   a plurality of local word line driver switches controlled by signals on the second plurality of conductive lines;
   word line drivers; and
   a third plurality of conductive lines configured to receive word line signals from the word line drivers, and electrically coupled to the plurality of intermediate layers via the plurality of local word line driver switches.

2. The memory device of claim 1, further comprising:
   control circuitry that causes the first plurality of conductive lines to select at least a first particular stack in the plurality of stacks, the second plurality of conductive lines to select at least the first particular stack in the plurality of stacks, and the third plurality of conductive lines to select at least one particular layer in the plurality of intermediate layers.

3. The memory device of claim 1, wherein the local word line driver switches are transistors with lateral gates positioned over lateral conductive channels that electrically couple the conductive strips and the third plurality of conductive lines.

4. The memory device of claim 1, wherein the local word line driver switches are transistors with gates surrounding vertical conductive channels that electrically couple the conductive strips and the third plurality of conductive lines.

5. The memory device of claim 1, wherein different layers of the plurality of intermediate layers are electrically coupled to different steps of staircase contacts, and different conductive lines in the third plurality of conductive lines are electrically coupled to the different steps.

6. The memory device of claim 1, wherein the second plurality of conductive lines includes a particular decoding line that selects multiple stacks in the plurality of stacks, the multiple stacks in the plurality of stacks are electrically coupled to a first set of multiple conductive lines in the first plurality of conductive lines, and different lines in the first set of multiple conductive lines select different stacks from the multiple stacks.

7. The memory device of claim 1, wherein a first conductive decoding line of the second plurality of conductive lines selects only one stack from the plurality of stacks.

8. The memory device of claim 1, further comprising:
   control circuitry that causes the first plurality of conductive lines to select at least the first particular stack in the plurality of stacks and deselect other stacks in the plurality of stacks, the second plurality of conductive lines to select at least the first particular stack in the plurality of stacks and deselect other stacks in the plurality of stacks, and the third plurality of conductive lines to select at least one particular layer in the plurality of layers and deselect other layers in the plurality of layers.

9. The memory device of claim 1, further comprising:
   a fourth plurality of conductive lines including bit lines electrically coupled to the plurality of semiconductive vertical structures,
   wherein the control circuitry causes the fourth plurality of conductive lines to select a subset of the plurality of semiconductive vertical structures, the subset arranged in a row orthogonal to the plurality of stacks.

10. The memory device of claim 9, wherein the third plurality of conductive lines are parallel to the fourth plurality of conductive lines.

11. The memory device of claim 1, further comprising:
    a first decoder electrically coupled to the first plurality of conductive lines; and
    a second decoder electrically coupled to the second plurality of conductive lines, wherein the first decoder and the second decoder are on first and second sides of the plurality of stacks on opposite sides of the plurality of stacks, and the first plurality of conductive lines is parallel to the second plurality of conductive lines.

12. A method, comprising:
  causing a first plurality of conductive lines to select at least a first particular stack in a plurality of stacks of conductive strips alternating with insulating strips, wherein the plurality of stacks includes at least a bottom layer of conductive strips, a plurality of intermediate layers of conductive strips, and a top layer of conductive strips, and wherein the first plurality of conductive lines controls a plurality of transistor switches at the top layer of the conductive strips;
  causing a second plurality of conductive lines controlling a plurality of local word line driver switches to select at least the first particular stack in the plurality of stacks; and
  causing the third plurality of conductive lines including global word lines to select at least one particular layer in the plurality of intermediate layers via the plurality of local word line driver switches,
  wherein the first plurality of conductive lines, the second plurality of conductive lines, and the third plurality of conductive lines assist selection of at least one of the memory elements in interface regions at cross-points between side surfaces of the plurality of stacks and a plurality of semiconductive vertical structures arranged orthogonally to the plurality of stacks.

13. The method of claim 12, wherein the local word line driver switches are transistors with lateral gates positioned over lateral conductive channels that electrically couple the conductive strips and the third plurality of conductive lines.

14. The method of claim 12, wherein the local word line driver switches are transistors with gates surrounding vertical conductive channels that electrically couple the conductive strips and the third plurality of conductive lines.

15. The method of claim 12, wherein different layers of the plurality of intermediate layers are electrically coupled to different steps of staircase contacts, and different conductive lines in the third plurality of conductive lines are electrically coupled to the different steps.

16. The method of claim 12, wherein the second plurality of conductive lines includes a particular decoding line that selects multiple stacks in the plurality of stacks, the multiple stacks in the plurality of stacks are electrically coupled to a first set of multiple conductive lines in the first plurality of conductive lines, and different lines in the first set of multiple conductive lines select different stacks from the multiple stacks.

17. The method of claim 12, wherein a first conductive decoding line of the second plurality of conductive lines selects only one stack from the plurality of stacks.

18. The method of claim 12, further comprising:
  causing the first plurality of conductive lines to select at least the first particular stack in the plurality of stacks and deselect other stacks in the plurality of stacks, the second plurality of conductive lines to select at least the first particular stack in the plurality of stacks and deselect other stacks in the plurality of stacks, and the third plurality of conductive lines to select at least one particular layer in the plurality of layers and deselect other layers in the plurality of layers.

19. The method of claim 12, further comprising:
  causing a fourth plurality of conductive lines to select a subset of the plurality of semiconductive vertical structures, the subset arranged in a row orthogonal to the plurality of stacks.

20. The method of claim 19, wherein the third plurality of conductive lines is parallel to the fourth plurality of conductive lines.

* * * * *